US011656857B2

(12) United States Patent
Canas Ferreira et al.

(10) Patent No.: US 11,656,857 B2
(45) Date of Patent: May 23, 2023

(54) METHOD AND APPARATUS FOR OPTIMIZING CODE FOR FIELD PROGRAMMABLE GATE ARRAYS

(71) Applicant: INESC TEC—Instituto de Engenharia de Sistemas de Computadores, Tecnologia e Ciência, Oporto (PT)

(72) Inventors: Afonso Soares Canas Ferreira, Oporto (PT); João Manuel Paiva Cardoso, Oporto (PT)

(73) Assignee: INESC TEC—Instituto de Engenharia de Sistemas, Oporto (PT)

( * ) Notice: Subject to any disclaimer, the term of this patent is extended or adjusted under 35 U.S.C. 154(b) by 0 days.

(21) Appl. No.: 17/265,970

(22) PCT Filed: Aug. 9, 2019

(86) PCT No.: PCT/EP2019/071491
§ 371 (c)(1),
(2) Date: Feb. 4, 2021

(87) PCT Pub. No.: WO2020/030807
PCT Pub. Date: Feb. 13, 2020

(65) Prior Publication Data
US 2021/0382702 A1 Dec. 9, 2021

(30) Foreign Application Priority Data

Aug. 9, 2018 (PT) .......................... 20181000054166
Aug. 14, 2018 (EP) ...................................... 18189022

(51) Int. Cl.
*G06F 8/41* (2018.01)
(52) U.S. Cl.
CPC ............ *G06F 8/4435* (2013.01); *G06F 8/433* (2013.01)

(58) Field of Classification Search
CPC ........ G06F 8/443; G06F 8/452; G06F 8/4441; G06F 8/433; G06F 8/4435
See application file for complete search history.

(56) References Cited

U.S. PATENT DOCUMENTS 6,507,947 B1 * 1/2003 Schreiber ................ G06F 30/30
717/160
10,025,566 B1 * 7/2018 Ahmed .................. G06F 8/4452
(Continued)

FOREIGN PATENT DOCUMENTS

WO 2018/078451 A1 3/2018

OTHER PUBLICATIONS

J. P. Pinilla and S. J. E. Wilton, "Enhanced source-level instrumentation for FPGA in-system debug of High-Level Synthesis designs," 2016 International Conference on Field-Programmable Technology (FPT), 2016, pp. 109-116, doi: 10.1109/FPT.2016.7929514. (Year: 2016).*

(Continued)

*Primary Examiner* — Marina Lee
(74) *Attorney, Agent, or Firm* — 24IP Law Group USA, PLLC; Timothy DeWitt

(57) ABSTRACT

A method for the generation of a hardware accelerator (20) is described. The method comprises inputting (110) a program (105) with a plurality of lines of code describing an algorithm to be implemented on the hardware accelerator (20) and generating (125) a dataflow graph in memory from the inputted program (105). The dataflow graph is optimized and an output program (140) created from the dataflow graph is output. The output program (140) is then provided to a high-level synthesis tool for generating the hardware accelerator (20).

8 Claims, 9 Drawing Sheets

(56) References Cited

U.S. PATENT DOCUMENTS

| | | |
|---|---|---|
| 2012/0330638 A1 | 12/2012 | Pell et al. |
| 2016/0070550 A1 | 3/2016 | Van Eijndhoven et al. |
| 2017/0024338 A1 | 1/2017 | Lavasani |
| 2019/0042760 A1* | 2/2019 | Gutson .................. G06F 21/54 |
| 2019/0370407 A1* | 12/2019 | Dickie ................ G06F 16/2433 |

OTHER PUBLICATIONS

S. Cheng and J. Wawrzynek, "Architectural synthesis of computational pipelines with decoupled memory access," 2014 International Conference on Field-Programmable Technology (FPT), 2014, pp. 83-90, doi: 10.1109/FPT.2014.7082758. (Year: 2014 ).*

A. Lotfi and R. K. Gupta, "ReHLS: Resource-Aware Program Transformation Workflow for High-Level Synthesis," 2017 IEEE International Conference on Computer Design (ICCD), 2017, pp. 533-536, doi: 10.1109/ICCD.2017.92. (Year: 2017).*

Tomas "Algorithms and tools for automatic generation of DSP hardware structures", https://citeseerx.ist.psu.edu/viewdoc/download?doi=10.1.1.125.6088&rep=rep1&type=pdf, 2006, total pages: 130. (Year: 2006).*

Liang-Fang Chao and E. Hsing-Mean Sha, "Scheduling data-flow graphs via retiming and unfolding," in IEEE Transactions on Parallel and Distributed Systems, vol. 8, No. 12, pp. 1259-1267, Dec. 1997, doi: 10.1109/71.640018. (Year: 1997).*

K. K. Parhi and D. G. Messerschmitt, "Static rate-optimal scheduling of iterative data-flow programs via optimum unfolding," in IEEE Transactions on Computers, vol. 40, No. 2, pp. 178-195, Feb. 1991, doi: 10.1109/12.73588. (Year: 1991).*

Philippe Coussy, Daniel D. Gajski, Michael Meredith, Andrés Takach, "An Introduction to High-Level Synthesis," IEEE Design & Test of Computers 26(4): 8-17 (2009).

João M. P. Cardoso, Markus Weinhardt, "High-Level Synthesis," Chapter 2, FPGAs for Software Programmers 2016, Dirk Koch, Frank Hannig, Daniel Ziener (eds.), Springer 2016, pp. 23-47.

João M. P. Cardoso, João Teixeira, José C. Alves, Ricardo Nobre, Pedro C. Diniz, José Gabriel F. Coutinho, Wayne Luk, "Specifying Compiler Strategies for FPGA-based Systems," FCCM 2012: 192-199.

Amir H. Ashouri, William Killian, John Cavazos, Gianluca Palermo, Cristina Silvano, "A Survey on Compiler Autotuning using Machine Learning," ACM Comput. Surv. 51(5): 96:1-96:42 (2019).

Zheng Wang, Michael F. P. O'Boyle, "Machine Learning in Compiler Optimization," Proceedings of the IEEE 106(11): 1879-1901 (2018).

A. Lotfi and R. K. Gupta, "ReHLS: Resource-Aware Program Transformation Workflow for High-Level Synthesis," 2017 IEEE International Conference on Computer Design (ICCD), IEEE, Nov. 5, 2017, pp. 533-536.

N. Moreano, E. Borin, Cid de Souza and G. Araujo, "Efficient data path merging for partially reconfigurable architectures," in IEEE Transactions on Computer-Aided Design of Integrated Circuits and Systems, vol. 24, No. 7, pp. 969-980, Jul. 2005.

O. Reiche, et al., "Generating FPGA-based image processing accelerators with Hipacc," 2017 IEEE/ACM International Conference on Computer-Aided Design (ICCAD), IEEE, Nov. 13, 2017, pp. 1026-1033.

J. P. Pinilla and S. J. E. Wilton, "Enhanced source-level instrumentation for FPGA in-system debug of High-Level Synthesis designs," 2016 International Conference on Field-programmable Technology (FPT), IEEE, Dec. 7, 2016, pp. 109-116.

Joshua S. Monson and Brad L. Hutchings. 2015. Using Source-Level Transformations to Improve High-Level Synthesis Debug and Validation on FPGAs. In Proceedings of the 2015 ACM/SIGDA International Symposium on Field-Programmable Gate Arrays (FPGA '15). ACM, New York, NY, USA, 5-8.

Y. Uguen, F. de Dinechin and S. Derrien, "Bridging high-level synthesis and application-specific arithmetic: The case study of floating-point summations," 2017 27th International Conference on Field Programmable Logic and Applications (FPL), Ghent, 2017, pp. 1-8 doi: 10.23919/FPL.2017.8056792.

S. Cheng and J. Wawrzynek, "Architectural synthesis of computational pipelines with decoupled memory access," 2014 International Conference on Field-Programmable Technology (FPT), Shanghai, 2014, pp. 83-90.

Canas Ferreira Afonso Soares: "Restructuring Software Code for High-Level Synthesis Using a Graph-based Approach Targeting FPGAs", Jul. 20, 2018 (Jul. 20, 2018), pp. 1-113, XP055916684.

* cited by examiner

METHOD AND APPARATUS FOR OPTIMIZING CODE FOR FIELD PROGRAMMABLE GATE ARRAYS

This application claims priority to and benefit of Portuguese Patent Application No. 20181000054166 filed on 9 Aug. 2018 and European Patent Application No. 18 189 022.9 filed on 14 Aug. 2018.

FIELD OF THE INVENTION

The invention relates to a method and apparatus for optimizing code for hardware accelerators.

BACKGROUND OF THE INVENTION

Field programmable gate arrays (FPGA) are becoming a popular solution for accelerating the execution of software applications. The use of high level synthesis (HLS) tools intends to provide levels of abstraction for software developers to enable the software developers to develop software code for use on FPGA-based hardware accelerators. However, the need to restructure the software code and to efficiently use directives require both mastering of the HLS tool used and the FPGA hardware on which the software code is to be run. The approach described in this document uses an unfolded graph representation, which can be generated from program execution traces, together with graph-based optimizations, such as folding, to generate suitable C code to input to HLS tools. The experiments show that the approach described in this document is capable of generating efficient hardware implementations only otherwise achievable using manual restructuring of the input software code and manual insertion of adequate directives.

Hardware accelerators, implemented using FPGAs, can provide the performance improvements and/or energy consumption savings needed in many systems. When optimized, these FPGA based hardware accelerators are capable of high performance combined with efficient energy consumption [1].

Custom hardware implementations of applications (also known as application-specific architectures) enable concurrent execution of multiple independent operations as long as the hardware provides enough resources. This concurrent execution accelerates the execution of algorithms that have high instruction-level parallelism (ILP). In order to design the hardware to execute the algorithms having a degree of ILP, current methods involve different skills and require the understanding of very distinct programming languages and tools. Describing efficient hardware is very time-consuming. These aspects impose barriers to the use and development of FPGAs as hardware accelerators.

In order to address these issues, there have been many efforts in the field of high-level synthesis (HLS). The HLS tools allow programmers to target the FPGA hardware using high-levels of abstraction, such as the levels of abstraction known in software programming languages such as C. The intention of these higher levels of abstraction is to allow developers to program the FPGAs more easily and be able to handle more complex applications without the time-consuming efforts needed by other approaches. However, even though the HLS tools raise the abstraction level, the HLS tools still require some hardware expertise by the programmer to implement optimized solutions on the FPGA hardware. Although the HLS tools may accept programming languages (such as C), the structure of that software code highly influences the resulting generated hardware [2].

Additionally, typical ones of the HLS tools may require additional directives or configurations to generate efficient implementations. The prior art HLS tools have a barrier of entry for the average skilled person in the art, which is in this case a software programmer By lowering this barrier of entry, more ones of the software developers would be able to use the computing power of the FPGA-based hardware to accelerate applications and/or to achieve significant energy consumption reductions.

C-based programming languages are a common input for many HLS tools [1]. As the C programming model is tailored to CPUs and does not consider the concurrent nature of hardware and the possible customization, these prior art HLS tools compensate these limitations by allowing programmers to guide the synthesis through providing configurations or directives.

It is also known that the structure of the software code has a large impact on the performance of the generated hardware. This hardware can be implemented as FPGAs or ASICs. Therefore, in the prior art, complex code restructuring is usually required, and the HLS tools and compilers may neither provide such optimizations nor ensure their automatic application. In order to make the C-based HLS more accessible there is needed a way to easily restructure the input software code. This document describes an approach to generate automatically optimized C code for targeting application-specific hardware (e.g., implemented using FPGAs). The code can then be used to manufacture an electronic circuit using FPGAs or ASICs.

PRIOR ART

Source to source optimizations have been the subject of study in the field of HLS. For example, Cong et al. [5] briefly introduces the issue of code restructuring and presents a framework to facilitate code restructuring for software developers. Cardoso et al. [6] present an approach to allow users to program strategies to apply code transformations and insertion of directives. The LegUP HLS tool [8] also accepts C as an input and implements code restructuring through a modified LLVM compiler [9] to implement HLS optimizations.

Also relevant are the approaches dealing specifically with streaming bas computations. For example, Mencer presents in [7] an approach that uses a C-based language called ASC. ASC has been designed to implement data-streaming based computation in hardware. Max-Compiler [10] is an HLS tool to implement streaming computations described as dataflow graphs in a programming language based on Java and named as MaxJ. In [11] the authors discuss data flow graph (DFG) optimizations for generating better FPGA implementations in the context of the MaxJ compiler. The approach in this document differs from the work previously presented as the method of this document is focused on source to source code restructuring to provide more friendly code for typical C-based HLS tools. It can be seen as orthogonal work as the method described can provide useful code restructuring for HLS tools such as LegUp and Vivado HLS. In comparison to the MaxCompiler approach, the approach described could be also used for providing restructured MaxJ code but in that case the method would need a MaxJ code generator as backend. In addition, we also note that this method can be used in the context of other input programming languages as the DFG used is obtained by instrumenting the original code of the application and by obtaining the graph vis the execution of the modified application.

The use of graphs as intermediate representations of compilers and HLS tools is common (see, e.g., Daniel D. Gajski, Nikil D. Dutt, Allen C.-H. Wu, and Steve Y.-L. Lin. 1992. High-Level Synthesis: Introduction to Chip and System Design. Kluwer Academic Publishers, Norwell, Mass., USA. and João M. P. Cardoso, Pedro C. Diniz, Markus Weinhardt, "Compiling for reconfigurable computing: A survey," ACM Comput. Surv. 42(4): 13:1-13:65 (2010). Typically, the structure of the input source code is represented by control dataflow graphs (CDFGs) or dataflow graphs (DFGs), or extensions of both, and code transformations and optimizations are then applied using those graphs.

One typical case is loop unrolling that internally can be implemented by replicating subgraphs with modifications of, for example, the loop control structure and the values of the induction variable. This is the typical way HLS tools apply some of the optimizations. Those graphs are even used to do allocation, biding and scheduling (three important tasks of HLS—see, for example, Philippe Coussy, Daniel D. Gajski, Michael Meredith, Andres Takach, "An Introduction to High-Level Synthesis," IEEE Design & Test of Computers 26(4): 8-17 (2009) João M. P. Cardoso, Markus Weinhardt, "High-Level Synthesis," Chapter 2, FPGAs for Software Programmers 2016, Dirk Koch, Frank Hannig, Daniel Ziener (eds.), Springer 2016, pp. 23-47. This approach is also used at the source to source compilers (some using tree representations and others using graph representations). In these compilers the graph after transformations is then input to a code generation stage that is responsible to generate the final code (e.g., C code in a C to C compiler).

HLS tools may require additional directives or configurations to generate efficient implementations. Prior art solutions such as HLS tools present a poor performance in highly complex code restructuring. In fact, the involved high complexity is in fact the reason that there does not exist code restructuring tools that automatically provide the degree of restructuring needed to generate more efficient hardware and it is common that users need to identify the optimizations and apply a sequence of those optimizations (see, e.g., João M. P. Cardoso, João Teixeira, José C. Alves, Ricardo Nobre, Pedro C. Diniz, José Gabriel F. Coutinho, Wayne Luk, "Specifying Compiler Strategies for FPGA-based Systems," FCCM 2012: 192-199).

For example, the ordering to apply compiler optimizations based on a selection of compiler optimizations is known as phase ordering and phase selection, respectively, and even in the context of traditional compiler optimizations (and not in terms of code restructuring) requires design space exploration (DSE) schemes and due to the non-existence of other more efficient solutions is being targeted by machine-learning techniques (see, e.g., Amir H. Ashouri, William Killian, John Cavazos, Gianluca Palermo, Cristina Silvano, "A Survey on Compiler Autotuning using Machine Learning," ACM Comput. Surv. 51(5): 96:1-96:42 (2019) and Zheng Wang, Michael F. P. O'Boyle, "Machine Learning in Compiler Optimization," Proceedings of the IEEE 106(11): 1879-1901 (2018). The problem is even more complex when considering deeper code restructuring and/or restructuring techniques involving loops and specific parameters (e.g. data dependencies and number of iterations).

Some prior art solutions can solve this complex phase selection and phase ordering problem by starting with the structure of the input program and efficiently representing it as a graph (e.g, a CDFG). However, these prior art solutions are very dependent of the existence in the compiler of particular optimizations that might be needed in the ordering to achieve a particular code restructuring, and the lack of a particular optimization may prevent the tool to generate higher-performance hardware.

International Patent Application No. WO 2018/078451 (Reconfigure io ltd) teaches an apparatus that specifically accelerates concurrent asynchronous programs to multiple FPGAs, but the apparatus of the prior art does not accelerate kernels to a single FPGA. This apparatus uses a specific input model—CSP.

A. Lotfi and R. K. Gupta, "ReHLS: Resource-Aware Program Transformation Workflow for High-Level Synthesis," DOI 10.1109/ICCD.2017.92, discloses the use of code transformations in the context of reducing the hardware resources resulting from the generation of hardware using HLS tools. The document teaches the use of DFGs built for the basic blocks of a representation of the input code using the open source LLVM intermediate representation IR. The approach disclosed in Lotfi et al searches for patterns common in the DFGs in order to identify any hardware resources that can be shared and thus reduce the design area needed for the FGPA. The generated code input to the HLS tool considers the patterns selected for resource sharing and uses HLS directives to guide the HLS tool.

The approach described in Lotfi et al is one example of the type of optimizations that can be applied to the DFGs used in our invention for possible hardware resource reductions. Such optimization would allow the selection of the subgraphs to be implemented using the same hardware resources or hardware resources with the support for merging data paths based on their similarities (see, for example, N. Moreano, E. Bonin, Cid de Souza and G. Araujo, "Efficient data path merging for partially reconfigurable architectures," in IEEE Transactions on Computer-Aided Design of Integrated Circuits and Systems, vol. 24, no. 7, pp. 969-980, July 2005. doi: 10.1109/TCAD.2005.850844).

Lotfi et al fail, however, to describe an optimization scheme to reduce memory transfers. Lotfi et al also do not add instrumentation code.

O. Reiche, et al, "Generating FPGA-based image processing accelerators with Hipacc" doi: 10.1109/IC-CAD.2017.8203894, discloses the use of Hipacc, which is a domain-specific language and compiler for image processing. The document discloses an example of the approaches in which a program in a DSL (Domain Specific Language) is used as an input and then the DSL code is translated to a programming language. The translated code is as an input to compilers and/or HLS tools. In the examples of Reiche et al, the example of translating programs in the Hipacc DSL to C code C/C++ and OpenCL code is disclosed. In the translation process typical compiler optimizations (applied at the abstract syntax tree (AST) level) are performed according to the target (e.g., FPGA or GPU). Reiche et al do not describe the unfolding and folding of the dataflow graph that could be generated by instrumenting the Hipacc DSL code or by generating a DFG from the internal AST and data-dependences J. P. Pinilla and S. J. E. Wilton, "Enhanced source-level instrumentation for FPGA in-system debug of High-Level Synthesis designs," doi: 10.1109/FPT.2016.7929514, teaches a method for instrumenting code in order to monitor/verify the behavior of the hardware generated by HLS tools. The idea is to inject the instrumentation code into the input code of the program in order to monitor behavior of the program. The injected instrumentation code is input to the HLS tool and the hardware generated includes both the hardware for implementing the behavior of the input original program and the circuitry for the monitoring of the behavior of the program. In other words, the instrumentation code of Pinilla et al provide monitoring points to understand and/or verify at runtime or during simulation the behavior of the generated hardware. Another example of a similar approach is the one presented in Joshua S. Monson and Brad L. Hutchings. 2015. Using Source-Level Transformations to Improve High-Level Synthesis Debug and Validation on FPGAs. In Proceedings of the 2015 ACM/SIGDA International Symposium on Field-Programmable Gate Arrays (FPGA '15). ACM, New York, N.Y., USA, 5-8. DOI: https://doi.org/10.1145/2684746.2689087.

The work in Y. Uguen, F. de Dinechin and S. Derrien, "Bridging high-level synthesis and application-specific arithmetic: The case study of floating-point summations," 2017 27th International Conference on Field Programmable Logic and Applications (FPL), Ghent, 2017, pp. 1-8. doi: 10.23919/FPL.2017.8056792 presents a source-to-source compiler approach to optimize arithmetic expressions using floating-point and fixed-point data types, and specially addressing sum-reduction patterns. The approach generates C/C++ code for HLS tools. Their approach described is another one of the many possible optimizations that could be integrated to further enhance the generation of code to HLS tools. The optimization of Uguen et al is directed towards the presence of sum-reduction operations involving fixed- and floating-point data.

The work in S. Cheng and J. Wawrzynek, "Architectural synthesis of computational pipelines with decoupled memory access," 2014 International Conference on Field-Programmable Technology (FPT), Shanghai, 2014, pp. 83-90. doi: 10.1109/FPT.2014.7082758 presents an approach that restructures the input code in order to provide pipelining implementations taking advantage of the decoupling of memory operations and data accesses from computations. Parts of the control data flow graph (CDFG) are clustered in subgraphs according to the kind of operations and then Cheng et al teach the generation of code considering decoupled execution of hardware units for each of the subgraphs. The restructured code is input to the HLS tool. This is a further one of the many possible optimizations to enhance the generation of code to HLS tools, in this case considering the decoupling of behavior (e.g., between memory accesses and computing) and the resultant enhancements of using coarser-grained pipelining schemes.

SUMMARY OF THE INVENTION

This document presents a method for generating optimization configurations of hardware accelerators. The method is based on a dataflow graph (DFG) representation of the computations (at arithmetic, logical, operator level) currently obtained by executing the critical functions of the application previously added with instrumentation code.

The document discloses a method of code restructuring that is able to provide when automatically applied to the structure of the input program code, would need an identification of the compiler optimizations (and the specific values of their parameters and of the target code elements) to be applied and the ordering to apply them (usually also applying some of them more than once).

By automatically injecting instrumentation code, the method outlined in this document, can have different input programming languages. One example, C code was considered as input in the embodiment. The invention is not however restricted to C.

The method used folding and unfolding graph operations and transforming the structure of the graph itself. The method has been implemented in a framework able to fully restructure the code of critical application kernels. The framework consists of two stage, a frontend and a backend. The frontend generates DFGs from the execution trace through injection of instrumentation code to the original version. The backend of the framework is capable of automatically restructuring the DFG and generate C code added with directives in an HLS-friendly way.

An embodiment targeting Xilinx FPGAs and benchmarking against the standard solution Vivado HLS is presented and illustrate the relevant speedup obtained by the method. When compared with the original C code, the C code generated by the method outperforms the original unmodified C code and significant speedups are achieved. The achieved C code is even comparable and, in most cases, better than manually optimized C code added with directives. When compared with the original unmodified C code the approach obtains implementations that are 30 to 100 times faster. When compared with C optimized with Vivado HLS directives the approach obtains implementations that are 2 to 15 times faster. However, the C code with directives generated by the framework can be always replicated by manual code transformations applied by experts. Thus, the approach can enable software developers to target efficient hardware accelerators using C code as input and typical HLS tools as backend, without requiring support of HLS, such as Vivado HLS, experts.

DETAILED DESCRIPTION OF THE INVENTION

Figure 1:
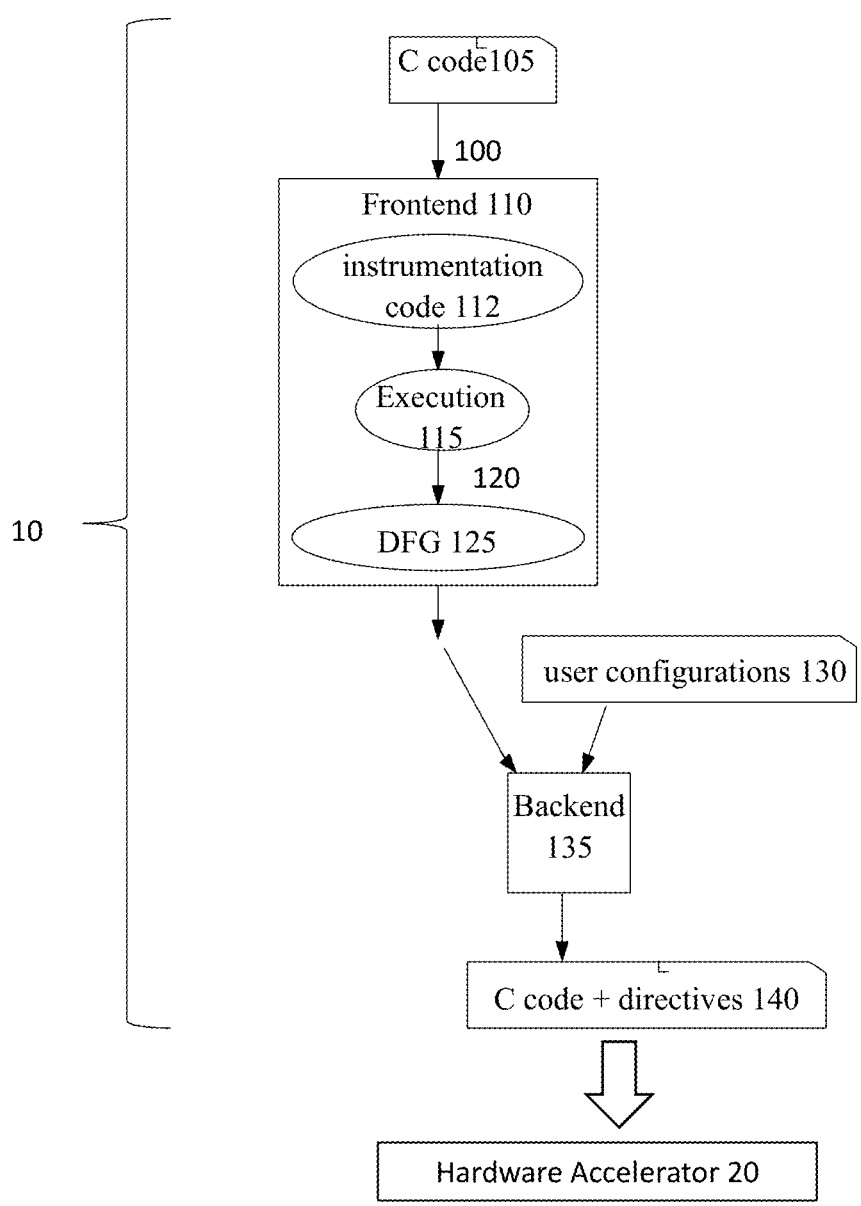
FIG. 1 shows the compilation flow of the method and apparatus of this invention

A method and apparatus 10 to automatically restructure C code targeting for HLS tools is disclosed and is shown in overview in FIG. 1. The code can be used as an input to a manufacturing unit for the configuration of hardware accelerators 20. The hardware accelerators 20 comprise a plurality of electronic components, such as logic gates, that can be programmed. The apparatus comprises a frontend 110 that is able to generate execution traces of a program as dataflow graphs (DFGs). The DFGs are then processed in a backend 135 to generate an output program for passing to the hardware accelerator 20. The output program comprises software code using, in this non-limiting example, software code in C for an HLS tool.

The DFGs are found to be a good representation of the dataflows in an application and express properties, such as parallelism, in the application. The identification of these properties enables improved implementations of the hardware. The frontend 110 enables the generation of the DFGs from multiple different input languages. This may allow the software programmers of different languages to use the C-based HLS tools. This document describes the backend 135 and the way in which the backend 135 manipulates and analyzes the DFGs to automatically generate the output program. The type of DFGs that the frontend 110 generates as well as the approach to build them from the input application source code will also be described.

FIG. 1 shows a compilation flow of the method of this disclosure to apply code restructuring. In a first step 100 the C-code 105 is input into the front end 110. The frontend 110 executes the C-code 105 in step 115 and generates in step 120 a DFG 125 of the execution trace of the algorithm in the C-code 105. The DFG 125 includes every operation from the original execution in step 115 and any data dependences are obligatorily maintained. It will be appreciated that a graph only records the dependencies of the algorithm and not the actual execution order of the algorithm of the C-code 105. Therefore, operations that can execute in parallel with each other appear without interdependencies in the graph of the DFG 125. It is therefore necessary to record separately the data dependencies.

The frontend 110 is generic as possible to fit many different inputs and is not limited to an implementation for C code input and can be easily ported to other software languages.

The input DFG 125 to a backend 130 is described in the dot graph description language. It is known that the dot graph description language has nodes that are described by an id and a sequence of attributes. Every one of the nodes has at least two attributes. A first one of the attributes is the label and the other one of the attributes is the type. The node can have three types, which are constants, variables, and operations. The label stores the name of variable, the value of a constant or the kind of operation depending on the type of the node. If the variable is an array, then the node also includes the index of the access to the array. Additionally, the variable nodes also hold as attributes the type of variable and whether the variable node is a local variable or an input of a function.

In an initial aspect of the disclosure, the frontend 110 only deals with kernels in the software code using basic operations. Any assignments of variables are represented with connections between different nodes (e.g., from a constant type node to a variable type node). Operations are represented by node type operations and operands and results are represented by the respective nodes and connected accordingly. In this aspect of the disclosure, the DFG 125 representing the execution of the kernel in the software code is to write out the dot description to a file during execution.

By injecting instrumentation code 112 (i.e., code that, once executed, output sections of the description of the DFG) into the original C code 105 and compiling and executing the modified C code, the input DFG is generated. The basic instrumentation rule is to append the instrumentation code before each statement in the original C code. The added instrumentation code describes the DFG nodes and edges representing the operations and operands of the associated C statement. For example, for an assignment statement without operations, the added instrumentation code 112 outputs a DFG section with two nodes, i.e. an input node and an output one together with the connecting edge.

The values of the nodes in the DFG 124 describe the current operation. Let us take an example Suppose the C-code 105 contains a statement such as a=b+c, i.e. variable a takes the value of the sum of the values in variables b and c. The execution of the instrumentation code generates a dot description of for each of the nodes for the variable c, b and a and includes as attributes for the nodes the variable names (e.g. a, b, or c), the type (e.g. integers) and their identification in terms of a left operand or a right operand.

Another example could be if the node represents a memory access. The added instrumentation code describes the node as a variable and the label is the access in a memory with the explicit memory index.

Figure 2:
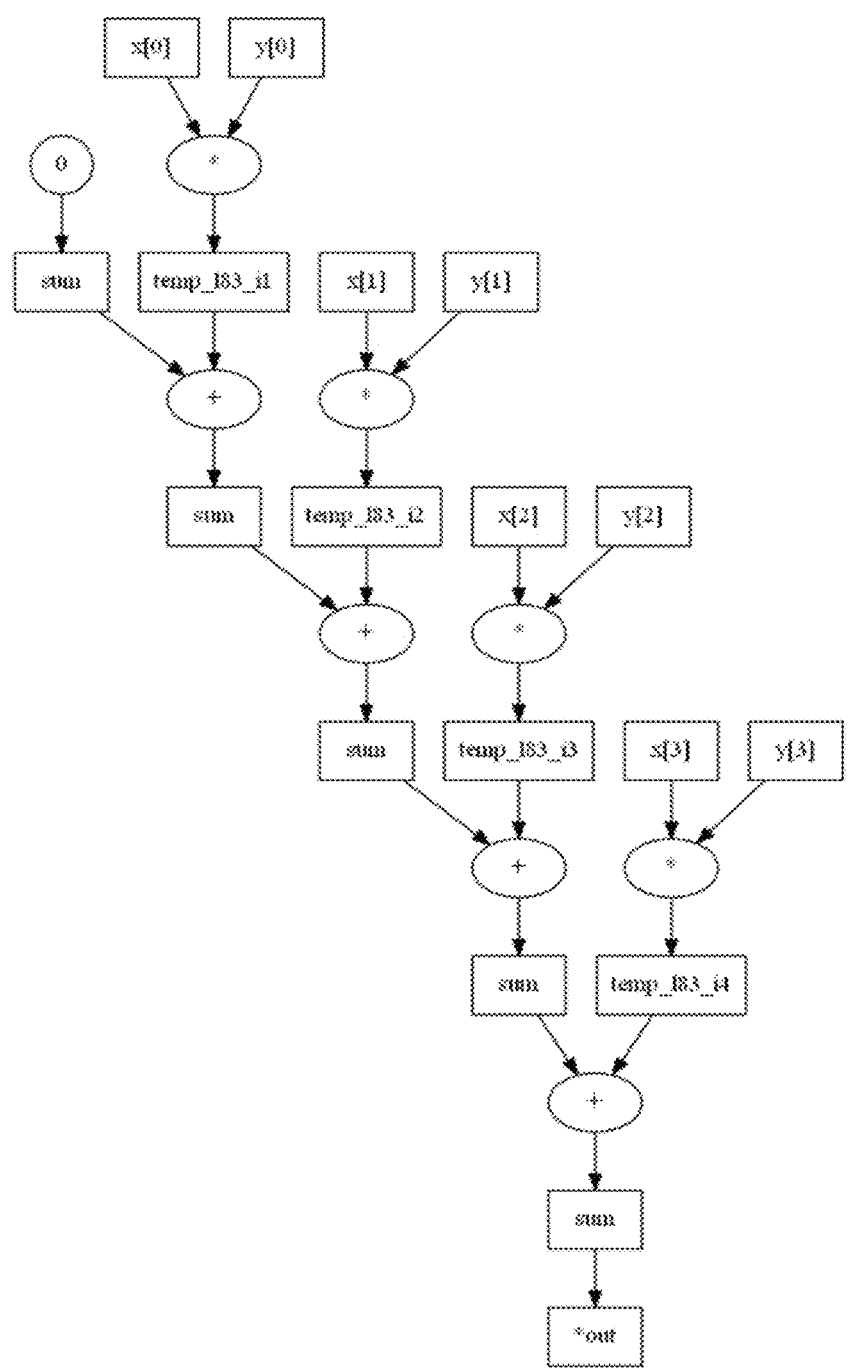
FIG. 2 shows the output of the frontend for the dot product kernel

The correct dependency needs to be considered. A variable can have multiple values during the execution of the software code represented by the C-code 105 in FIG. 1. For every new value that the variable takes, a new node will be created in the graph in the DFG 125. The method and apparatus also must be able to know the id of the node that corresponds to the most recent value of the variable having multiple values, instead of any outdated value. To ensure this dependency, the instrumentation code 112 uses a rename of the variable name to reflect the most recent assignment. For example, the instrumentation code 112 adds to the variable name a number representing that assignment. So, suppose if the code starts with the sequence:

a=b; d=a+c; a=d+a;

The method and apparatus use the ids a_1, b_0 for the first operation. This is followed by the ids d_1, a_1, c_0 for the second operation and a_2, d_1, a_1 for the last operation. FIG. 2 shows the resulting DFG 125 from the execution of a dot product kernel added with the instrumentation code 112.

The DFG 125 is constructed from the execution of the application instead of generating execution traces and then building the DFG 125 from the traces to avoid another step and bearing in mind a possible future compact DFG representation without needing to output large traces and subsequent DFG compactations.

The structure of the backend 135 and its implementation will now be described. The backend 135 comprises various step set out in FIG. 3 addressing analysis and optimizations of the DFG 125 generated by the frontend 110. The exact optimizations applied depend on the graph and the configurations 130.

The number of simultaneously load/stores supported by the hardware accelerator 20 (e.g. by using the number of memory ports available) can be defined by the user so that the method and the apparatus explicitly generate code in the output program with an appropriate number of load/store statements. The inputs and the outputs of the kernel as well as some of the optimization options are also set. Optimization options include, but are not limited to, array partitioning or loop pipelining. The backend 135 is the heaviest and most complex part of the method and apparatus as the backend 135 implements all the code restructuring, optimizations and injects the directives for the HLS tool.

Figure 3:
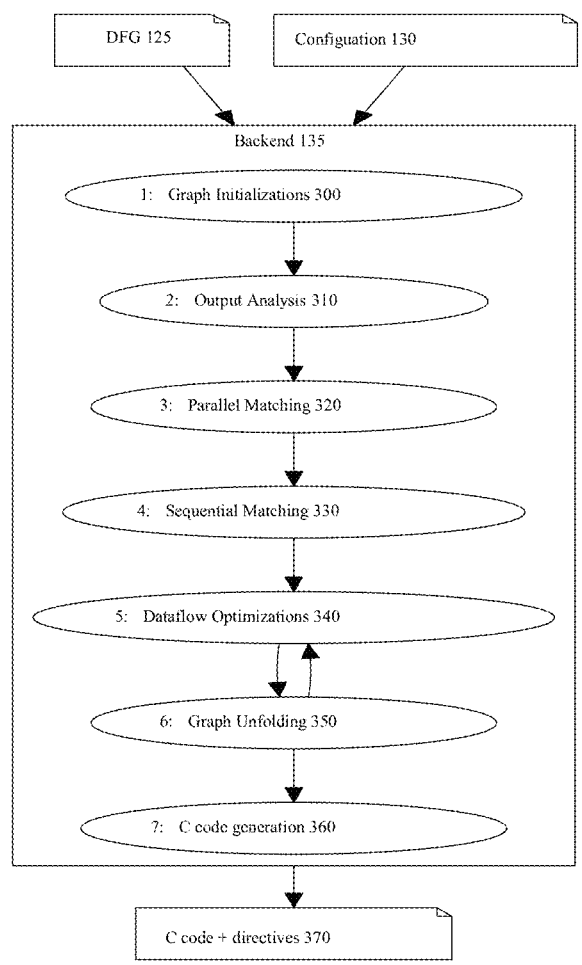
FIG. 3 shows a representation of the backend.

The backend 135 is divided into seven separate steps as shown in FIG. 3. The method starts by pruning the graph in the DFG 125 and identify any repeating patterns in the application and recorded in the DFG 125 to compact the graph. Afterwards the method optimizes the compact description to obtain an improved representation of the dataflow. The repeating patterns can be folded in the graph. Since the repeating patterns may occur multiple times, it is possible to optimize a large part of the application by improving these repeating sequences.

The first three steps shown in FIG. 3 (i.e., Graph Initializations step 300, Output Analysis step 310, and Parallel Matching Step 320) deal with the graph processing and the identifying of the repeating patterns. The subsequent three steps (steps 330, 340 and 350) optimize the dataflow, and the last step (step 360) produces the C code added with HLS directives.

The first step 300 of the graph initialization is dedicated to some steps to initialize, pre-process and analyze the input graph prior to the next optimizations. This first step 300 includes the pruning of any unnecessary nodes in the DFG 125. This step 300 can improve the efficiency of further algorithms. The first step 300 also removes any local arrays (whenever the local arrays can be promoted to scalar variables) from the input code, implementing them in multiple unique variables to avoid using BRAMs (on-chip RAMs, known in Xilinx FPGAs as Block RAMs) in the FPGA.

The second step 310 analyzes the outputs and prepares the graph for the next step 320. In one aspect, the initial graph might be very large and can be compacted in many ways. The method and apparatus compact the graph by determining the existence of patterns between the sequences that generate different outputs. In case the kernel has a single output, this step 310 and the following step 320 are skipped.

In case the output is an array, the method and apparatus identified in step 310 the individual dataflows for every one of the output values in the array. Before advancing to the next step 320, the method and apparatus separates the common operations on the output from the operations that are unique to every one of the outputs. Thus, in case of multiple ones of the outputs, the method and apparatus will produce a graph with all of the common operations and then a list of graphs with the unique operations that generate each of the outputs. The third step 320 compares the separate dataflows identified in the previous step 310. The goal of this step 320 is to compact all of these separate dataflows into a loop that can be represented by a single sequence. If this compaction is successful, the size of the graph will be greatly reduced. Since this single sequence is going to be repeated multiple times, if the graph is optimized then a large part of the applications execution will also be optimized. Without the optimization, it would be necessary to optimize all the sequences separately despite the sequences being similar. Also, without loops the resulting C code may be too unfolded leading to unfeasible implementations (even considering resource sharing schemes). If this step 320 is successful, the method and apparatus have a graph of common operations that lead into a graph that describes the loop. This hierarchical representation allows the representation of more complex code structures.

Figure 4:
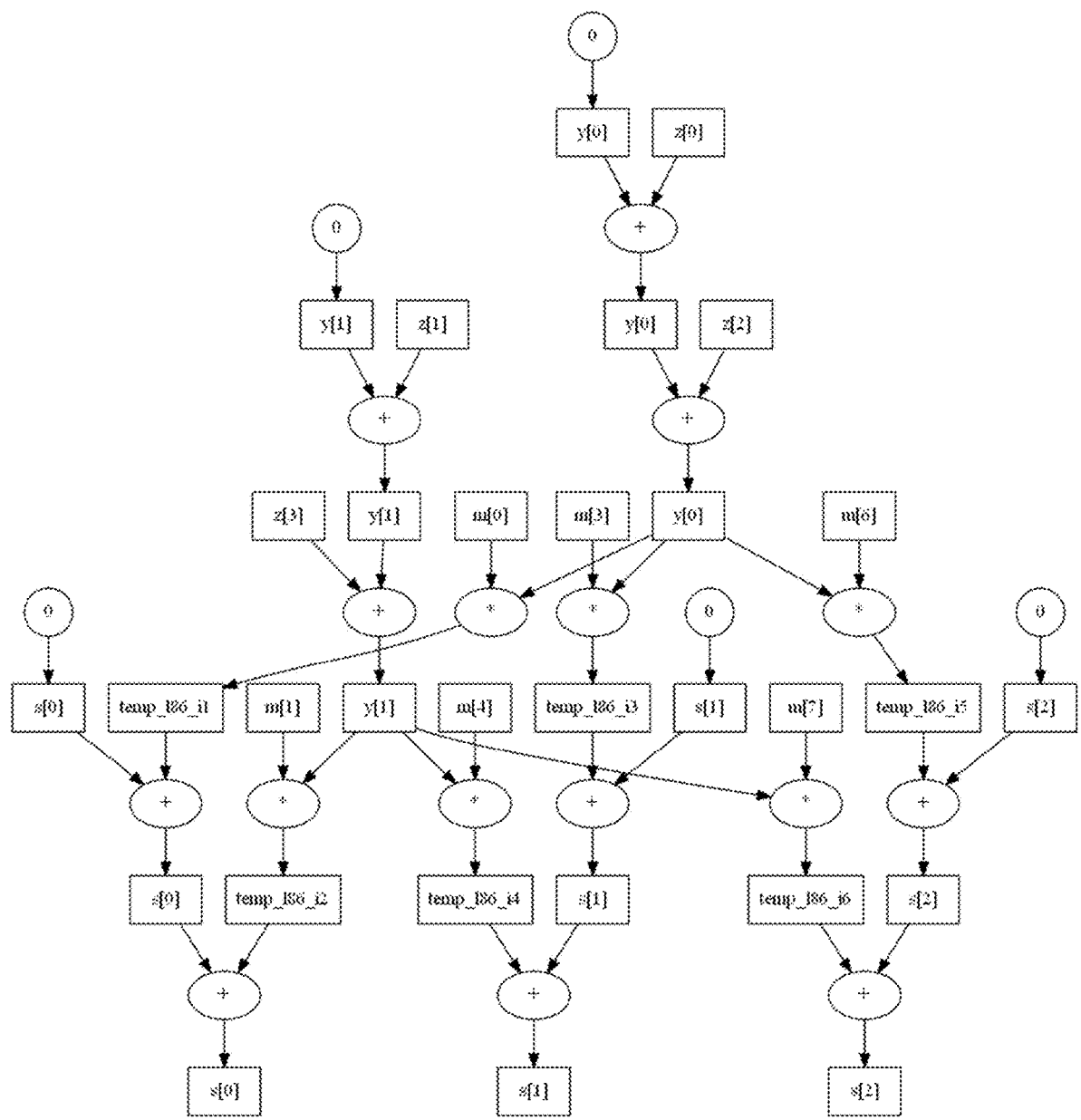
FIG. 4 shows DFG generated at the frontend for the filter subband benchmark considering Nz, Ns, Nm, and Ny equal to 4, 3, 1024 and 2 respectively.

Reference is made to FIG. 4 to show the resulting DFG from the frontend for the filter subband benchmark (see Listing 1) in case of Ny, Nz and Ns being 2, 4 and 3 respectively. Comparing with the source code in Listing 1, one can recognize the calculations of the y values and the different results of the s array. After passing through the first step 310 (pruning of unnecessary nodes) the result is in FIG. 5. In the new DFG the variable information is now stored in the edges leading to a more compact graph.

Listing 1 Filter sub band source code

```
void filter_subband_golden(double double s  z [Nz],
[Ns], double m[Nm]) {
    double y [Ny ] ;
    int i , j ;
    for( i =0; i <Ny; i ++){
        y[i]   = 0.0;
        for( j =0;j <( int )Nz/Ny; j ++)
            y [i]  += z [ i +Ny* j ] ;
    }
    for( i =0; i <Ns ; i ++){
        s [ i ]=0.0;
        for ( j =0; j <Ny; j ++)
            s [ i ]   += m[Ns* i + j ] * y [ j ] ;
    }
}
```

Figure 5:
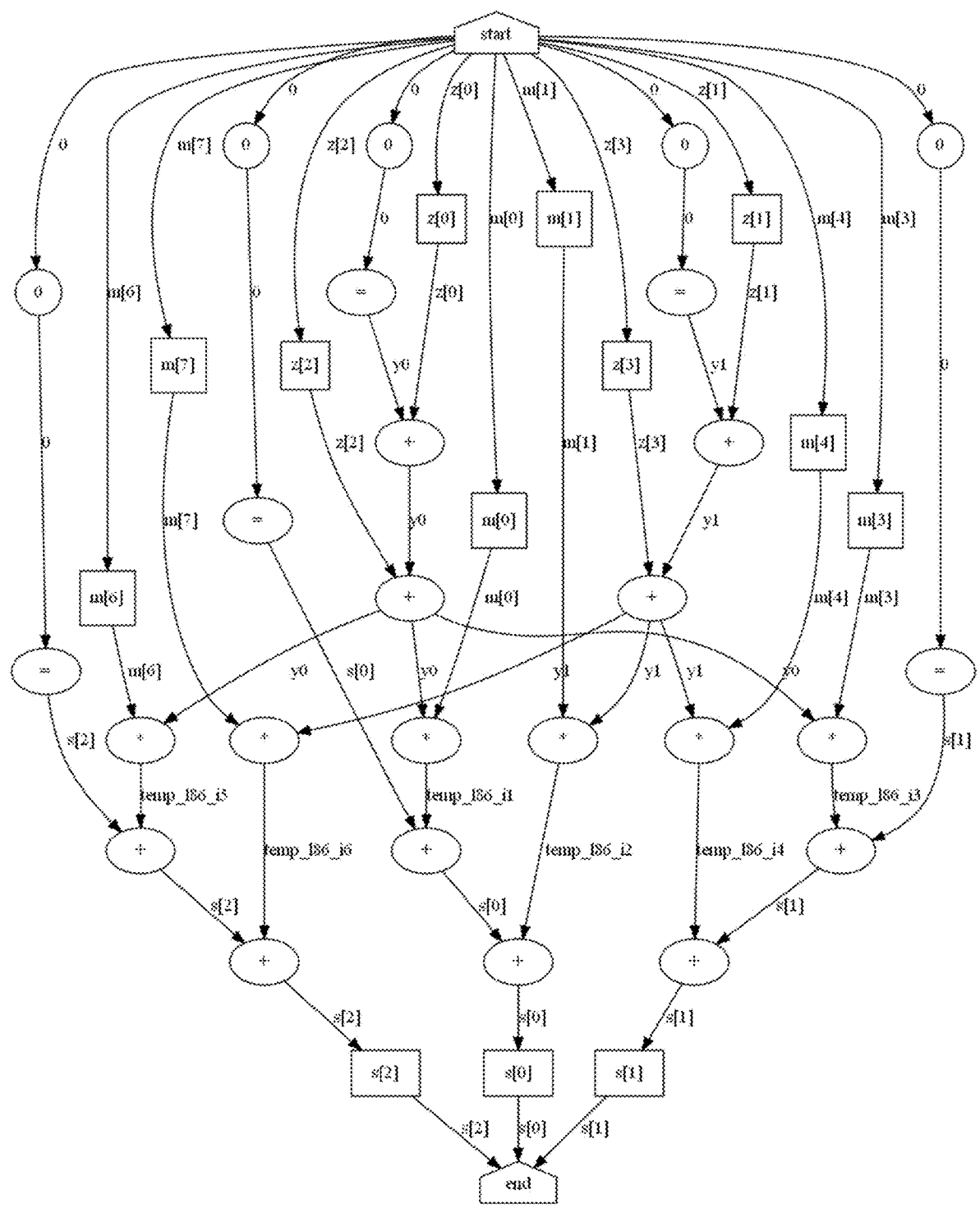
FIG. 5 shows Filter subband benchmark after the first step considering Nz, Ns, Nm, and Ny equal to 4, 3, 1024 and 2 respectively.
Figure 6:
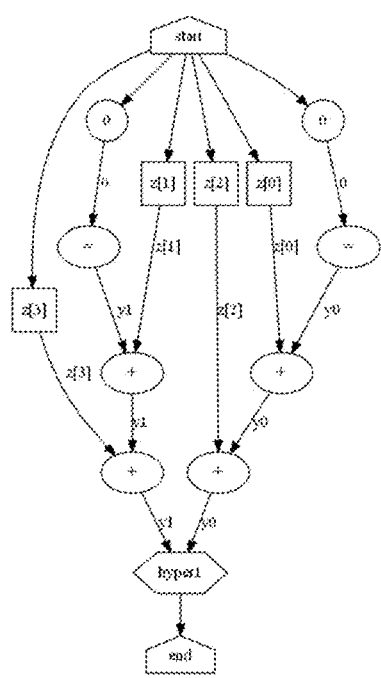
FIG. 6 shows Filter subband benchmark common operation subgraph after the second step considering Nz, Ns, Nm, and Ny equal to 4, 3, 1024 and 2 respectively.
Figure 7:
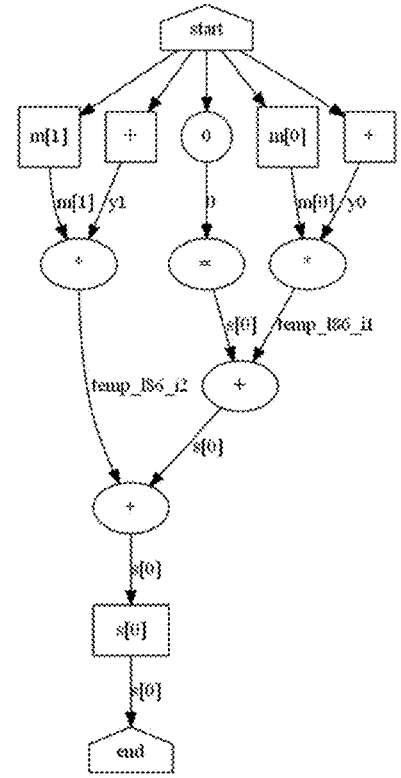
FIG. 7 shows Filter subband benchmark unique operations subgraph for the first output after the second step considering Nz, Ns, Nm, and Ny equal to 4, 3, 1024 and 2 respectively.
Figure 8:
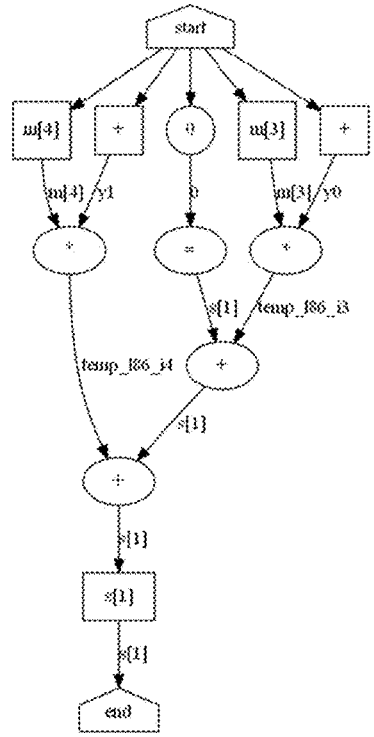
FIG. 8 shows Filter subband benchmark unique operations subgraph for the second output after the second step considering Nz, Ns, Nm, and Ny equal to 4, 3, 1024 and 2 respectively.
Figure 9:
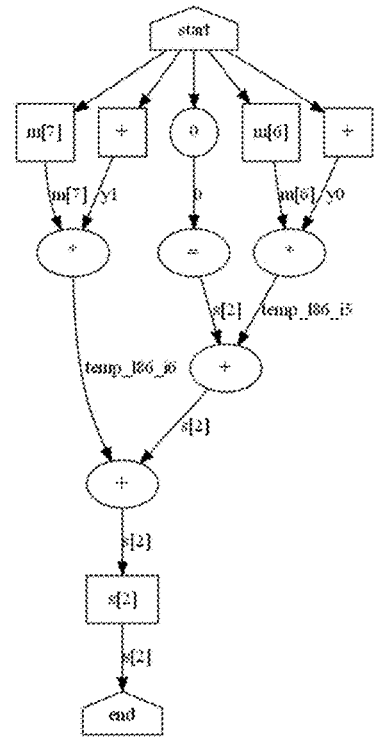
FIG. 9 shows Filter subband benchmark unique operations subgraph for the third output after the second step considering Nz, Ns, Nm, and Ny equal to 4, 3, 1024 and 2 respectively.

Reference is made to FIG. 6, FIG. 7, FIG. 8, and FIG. 9 to show the result of the second step 310 separation on the DFG previously shown in FIG. 5. FIG. 7, FIG. 8, and FIG. 9 show the segments of the original dataflow that are unique for each of the three outputs. FIG. 6 shows the common operations. When compared with the original dataflow, all these segments can be recognized. The separation is constituent with the original DFG and the source code in Listing 1, as the y values are given for every output and so the y-values are common to every output. On the other hand, the application of these y values to the s array are unique to each of the output. Applying the second step 310 to the filter subband benchmark with Ny, Nz and Ns being 64, 512 and 32 respectively results in the code in Listing 1.

The separation between common and unique nodes of the second step 310 is necessary for the success of the third step 320. If these dataflows contained the common operation, then the dataflows would be trivially matched in the third step 320 and included in a loop although the dataflows only need to be done once in the program and not multiple times per output. For example, the filter sub band benchmark shown in Listing 1 comprises two nested loop sets. The first loop calculates a y vector whose values are used in the second loop to calculate the outputs. In the third step 320 (Parallel Matching), the method and apparatus match the unique output sequences and identifies a loop like the second loop with its inner loop unrolled. Without separation of the common and unique nodes in the second step 310, the method and apparatus would also match the calculation of the y values, and the method would generate a loop that calculates those values again for every single one of the outputs. That implementation would be vastly worse than the original based on the code generated so the separation is part of the method.

Applying the third step 320 matching to the previous example results in the three separate DFGs being matched successfully (FIG. 7, FIG. 8, and FIG. 9) and therefore, all the three segments can be implemented in a loop and are represented by the FIG. 7, which is the first iteration of the Loop. Listing 3 shows the code resulting from applying the third step 320 matching too.

Listing 3 Filter sub band after third step 320 of the method and considering an execution with Nz, Ns, Nm, and Ny equal to 512, 32, 1024, and 64, respectively.

```
void filter_subband_parallel ( double z [512] ,
double s [32] , double m[1024]){
    y0=0;
    y0=y0+z[0];
    ... \\calulation of y values
    y64=y64+z[512]
    for (i=0;i<32;i++){
    #pragma HLS pipeline
        s[i]=0;
        temp_l86_i1=m[i*32]*y0;
        temp_l86_i2=m[i*32+1]*y1;
        ...
        s[i]=s[i]+temp_l86_i1;
        ...
        s[i]=s[i]+temp_l86_i64;
    }
}
```

The purpose of the fourth step 330 (Sequential Matching) is to implement pipelining. In the third step 320 we dealt with the parallelization of the outputs. However, afterwards there is still a large graph with a lot of opportunities for optimization. In the fourth step 330 the method and apparatus identify a potential variable satisfying certain criteria and pipelines the graph along this variable. In one aspect, the method chooses the one of the variables which is written more often. This is a heuristic that attempts to build the longest pipeline. Then the method and apparatus match the sequences that generate each new value of the chosen variable to identify a loop that can be pipelined. The matching algorithm pipeline traverses the graph hierarchy that was built in the previous step and is illustrated in FIGS. 6 and 7. In case the pipeline breaks the previous loop, the method and apparatus prioritize the loop in this fourth step 330. The fourth step 330 restructures the graph to implement the resulting pipeline. This fourth step 330 has the benefit of further compacting the graph as well as improving the structure of the graph.

An example of the impact of this step is its application to the filter sub band benchmark. By analyzing the original code in Listing 1 it is clear that, every time a y value is calculated, the y value can be immediately used, while other y values are being calculated. This relationship is not explicit in the original code and therefore the HLS tools might have difficulties recognizing this opportunity for parallelism. However, through the DFG representation this parallelism is easier to identify. When the graph of this benchmark reaches the fourth step 330, the method and apparatus select to pipeline along the vector s, leading to the code in Listing 2.

This modified description of the algorithm in Listing 2 exposes the parallelism clearly and implements a pipeline that can take advantage of the parallelism.

Listing 2 Filter sub band after fourth step 330 of the method and considering an execution with Nz, Ns, Nm, and Ny equal to 512, 32, 1024, and 64, respectively.

```
void filter_subband_pipe ( double z [512] ,
double s [32] , double m[1024]){
    s[0]=0;
    ...
    s[31]=0;
    for ( int i =0; i < 64; i = i + 1){
    #pragma HLS p i p e l i n e
        y0=0;
        y0=z [ i ] + y0 ;
        y0=z [ i +64] + y0 ;
        y0=z [ i +128] + y0 ;
        y0=z [ i +192] + y0;
        y0=z [ i +256] + y0;
        y0=z [ i +320] + y0 ;
        y0_w0=z [ i +384] + y0 ;
        y0=z [ i +448] + y0 ;
        for ( int j =0; j <32;j = j + 1){
            temp_l86_i1=m[(32)* j + i ] * y0 ;
            s [ j ]= s [ j ]  + temp_l86_i1 ;
        }
    }
}
```

Figure 10:
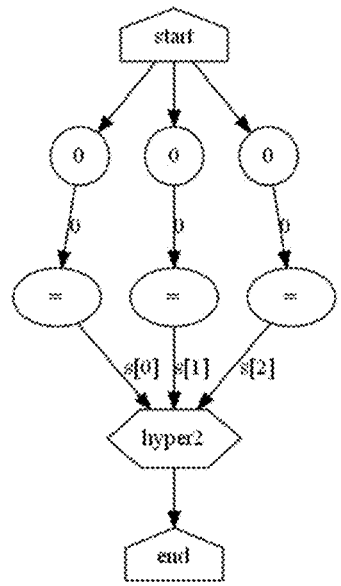
FIG. 10 shows Filter subband benchmark non looped dataflow after fourth step pipelining considering Nz, Ns, Nm, and Ny equal to 4, 3, 1024 and 2 respectively.
Figure 11:
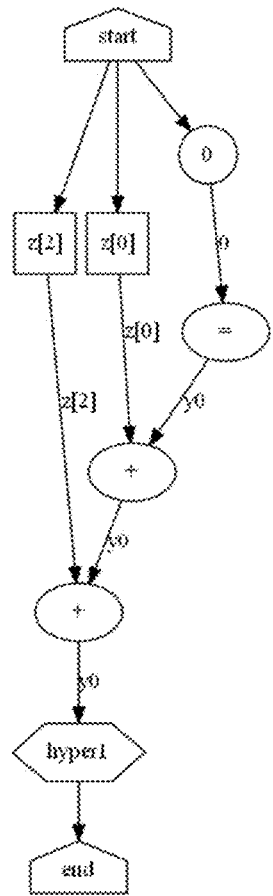
FIG. 11 shows Filter subband benchmark outer loop dataflow after fourth step pipelining considering Nz, Ns, Nm, and Ny equal to 4, 3, 1024 and 2 respectively.
Figure 12:
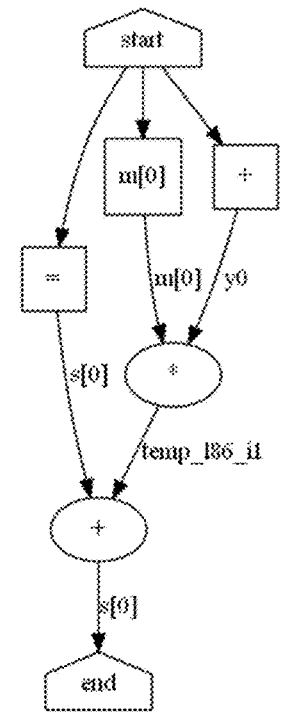
FIG. 12 shows Filter subband benchmark inner loop dataflow after fourth step considering Nz, Ns, Nm, and Ny equal to 4, 3, 1024 and 2 respectively.

By applying the fourth step 330 pipelining to the filter subband benchmark the method and apparatus obtains the DFGs shown in FIG. 10, FIG. 11, and FIG. 12. The graph is pipelined along the array s. The subgraphs in FIG. 11 and FIG. 12 represent single iterations of the outer loops and the inner loops of the pipelining. In each iteration, the outer loop calculates a y value, which is then used in the inner loop. In the inner loop, each y is used to calculate all the outputs of the s array. The sub graph in FIG. 10 shows the dataflows that did not match the pipelining. In this case, the dataflows were the initializations of the s array.

The fifth step 340 is dedicated to applying dataflow optimizations. In one aspect, this fifth step 340 optimizes memory accesses. One non-limiting example of the optimization at this fifth step 340 is memory reuse. The method and apparatus analyze the current loops to identify if there are redundant memory accesses. If this redundancy follows a pattern, the method and apparatus use buffers to store values between iterations reducing the number of memory reads. This can greatly minimize the memory bottlenecks of certain applications. This memory optimization can be applied to the loops of the third step 320 and the fourth step 330. If the loop at the third step 320 fits the criteria then the fourth step 330 is skipped and this optimization is applied, since optimizing the accesses changes the dataflow and prevents the pipeline in the fourth step 330 from being implemented.

Another optimization that can be chosen is the full partitioning of arrays to diminish memory bottlenecks. The previously described optimization reduces memory accesses through data reuse by storing values in buffers. Another way of lowering the memory bottleneck is through array partitioning directives provided by HLS tools. In this case, the method and apparatus make a final pass through the whole DFG. Based on the number of separate concurrent accesses to the memory, the method and apparatus is able to set an appropriate array partitioning factor so that the maximum number of concurrent memory accesses detected can be scheduled in a single cycle. This optimization can significantly increase the resource usage. Firstly, by using more of the BRAMs and secondly by lowering the memory bottleneck so that more of the operations can be executed in parallel. This optimization does not change the structure of the graph, but only leads to different directives. When applied to the filter subband function, this optimization injects the array partitioning directives included in Listing 4.

---
Listing 4 Filter sub band after completely passing
the fifth step 340 and the sixth step 350 of the method
and considering an execution with Nz, Ns, Nm, and
Ny equal to 512, 32, 1024, and 64, respectively.

```
void filter_subband_result(double z[512],
double s[32], double m[1024]){
#pragma HLS array_partition
variable=s cyclic factor=16
#pragma HLS array_partition
variable=z cyclic factor=16
#pragma HLS array_partition
variable=m cyclic factor=64
        s[0]=0;
        ...
        s[31]=0;
        for( int i =0; i < 64; i=i+4){
        #pragma HLS pipeline
partial_1_1_w4=z[i+320] + z[i+256];
partial_1_2_w5=z[i+192] + z[i+128];
partial_1_3_w6=z[i+64] + z[i];
partial_1_0_w3=z[i+448] +z[i+384]; ...
y0=y0_w10 + final_partial_v_w9;
y0_a10=y0_a10_w24       +
final_partial_v_a10_w23;
y0_a11=y0_a11_w26       +
final_partial_v_a11_w25;
y0_a12 =y0_a12_w28      +
final_partial_v_a12_w27; for( int j =0; j < 32;
j=j+1){
temp_l86_i1=m[(32)*j+i] * y0;
temp_l86_i1_a12=m[(32)*j+i+3]   *
y0_a12;
temp_l86_i1_a11=m[(32)*j+i+2]   *
y0_a11;
temp_l86_i1_a10=m[(32)*j+i+1]   *
y0_a10;
partial_1_1_w1=temp_l86_i1_a12 +
temp_l86_i1;
partial_1_0_w0=temp_l86_i1_a10 +
temp_l86_i1_a11;
// Start of Level 4:
final_partial_v_w2=partial_1_0_w0
+ partial_1_1_w1;
// Start of Level 5:
s[j]=s[j] + final_partial_v_w2; }
        }
}
```
---

Figure 13:
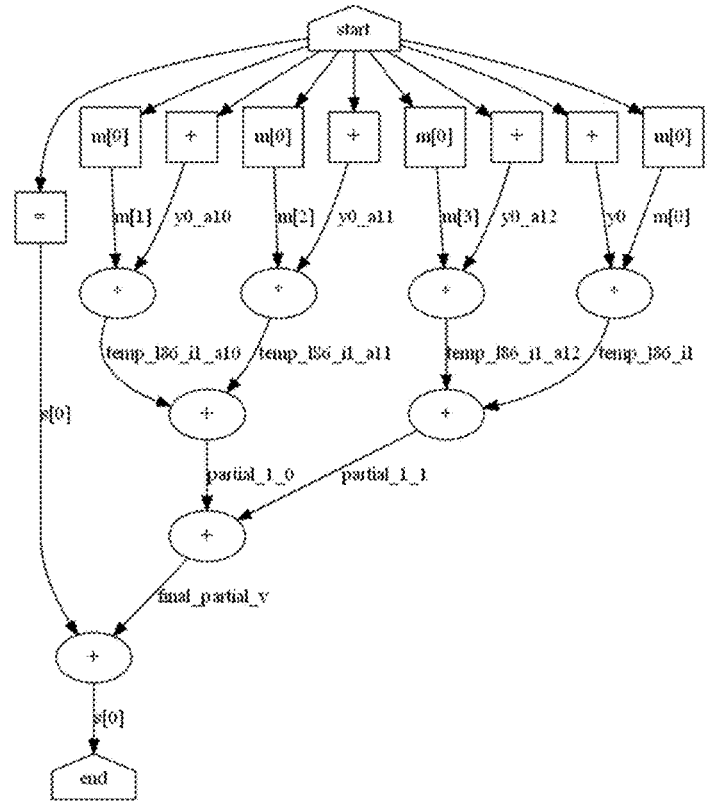
FIG. 13 shows Filter subband benchmark inner loop dataflow arithmetically optimized after fifth step considering Nz, Ns, Nm, Ny and an unroll factor equal to 512, 32, 1024, 64 and 4 respectively.

One type of optimization focuses on arithmetic optimizations. One of these is the accumulation optimization, which restructures an accumulation as a sequence of partial sums. The back end first detects an accumulation chain. Then, the backend removes the chain and instead implements the same calculations through a balanced tree (provides more ILP) structure. FIG. 13 shows a balanced accumulation compared to the chain in FIG. 14. Instead of the four sequenced sum, the new dataflow consists of a tree with two parallel additions, followed by another addition. The result of the balanced tree is then summed with the s value from the previous iteration. It is through this unfolding the method and apparatus obtain the partial sums seen in the code in Listing 4.

The sixth step 350 unfolds the loops that the method and apparatus generated to expose more ILP. The unfolding is implemented by replicating the dataflow of a loop, while ensuring that dependencies between iterations are maintained. Unfolding the loops can lead to more optimizations so this sixth step 350 can be followed by the fifth step 340. The method unfolds the loops based on the number of simultaneously load/store indicated in the configuration file 130. Once the sixth step 350 receives the DFG from the fifth step and there are no longer any more loops to unroll it, the DFG is sent to the final step.

Figure 14:
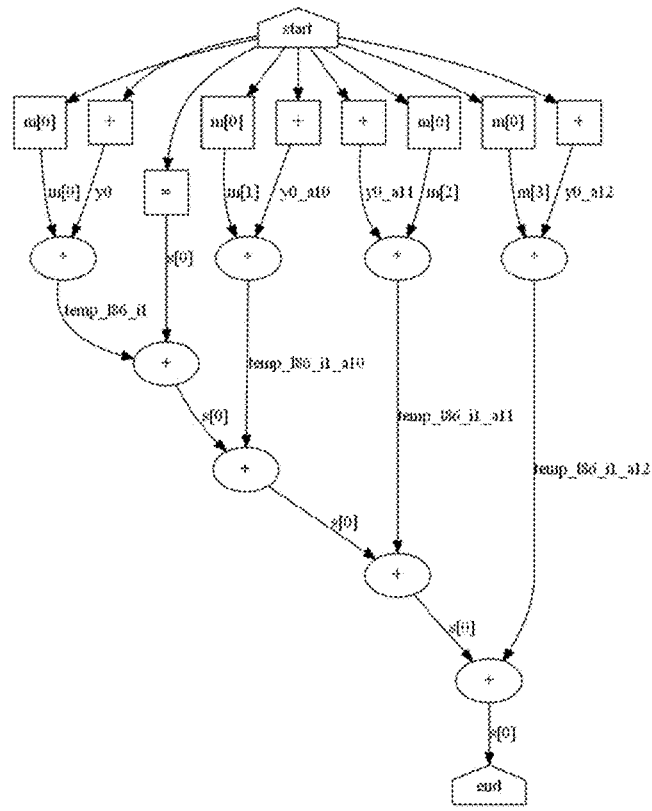
FIG. 14 shows Filter subband benchmark inner loop dataflow unrolled after sixth step considering Nz, Ns, Nm, Ny and an unroll factor equal to 512, 32, 1024, 64 and 4 respectively.

FIG. 14 shows the result of unfolding the inner loop of filter subband pipeline loop shown in FIG. 12. The backend replicates the dataflow, in this case a sum and a multiplication, and then connects the dataflow to maintain the correct dependencies between the iterations, resulting in the accumulation chain. In the edges the updated accesses to the memory and the copied variables with an append label for differentiation are seen. This unfolded dataflow is sent back to the fifth step 340 which applies the optimizations mentioned above. It is through this unfolding the method obtains the unfolded code seen in the code in Listing 4. In that case the outer loop was unfolded by a factor of 4.

The last step 360 is dedicated to outputting the program for the hardware accelerator by writing the output C code with any directives. The method and apparatus write out the C code, that the generated DFG 125 represents, and adds the necessary directives such as memory partitioning based on the number of concurrent memory accesses specified in the configuration file 130. Finally, the output program can be provided to the hardware accelerator in step 370.

In alternatives embodiments, the method and apparatus can also obtain the input DFG by:
(a) Executing the application with instrumentation code that reports a textual representation of the DFG (such as dot for GraphViz) when the application is executed;
(b) Executing the application with instrumentation code that reports the instructions executed and then a software tool can build the DFG from the execution traces;
(c) Reporting or monitoring the assembly, bytecode or intermediate representation instructions executed (this might involve disassemble and memory disambiguation).
(d) A compiler that can fully unroll loops and inline functions and generates the DFG of the resultant code (when dealing with values dependent on the input data the compiler could rely on information about the typical values, minimum, average, and maximum expected).

The method and apparatus of this document improves the execution time, power and energy consumption when targeting diverse computing platforms. Although an example focusing on code restructuring and directives insertion for HLS tools for FPGAs (and specially the Xilinx Vivado HLS tool) has been presented, this invention can be also used in the context of:
(a) Other HLS tools targeting FPGAs (such as LegUp) requiring possible modifications in terms of the directives output;
(b) HLS tools targeting ASICs;
(c) Code generation of OpenCL code targeting FPGAs;
(d) Code generation of OpenCL or CUDA code targeting multicores and/or GPUs;
(e) C code generation targeting multicore CPUs and multiple CPUs, possibly generating multithreaded code using a thread library or C code extended with directive-driven programming models such as OpenMP and OpenACC;
(f) Suitable C code generation for SIMD architectures and suitable for vectorization;

Experimental Results

This section presents the first experimental results achieved by the method and apparatus of this document. A series of benchmarks was used. All the benchmarks consist of operation heavy algorithms with very little control flow and represent DSP algorithms. The benchmarks are either from the DSPLIB from Texas Instruments [3], the UTDSP Benchmark Suite [4] or from an MPEG application. The simplest benchmark used is dotproduct from DSPLIB. The autocorrelation benchmark from DSPLIB is also used. The 1D fir benchmark is a typical code implementing a FIR (Finite Impulse Response) filter with N taps. The filter sub band benchmark is from an MPEG application. 2D Convolution is the largest benchmark which is a kernel that performs a 2D convolution. This convolution is part of the Sobel edge detection application from UTDSP.

TABLE 2

Versions of input code for comparisons

| Comparison code | Brief Description |
|---|---|
| C | Original code without any modifications |
| C-inter | Input code optimized with basic directives such as the pipeline directive |
| C-high | Improves the C-inter implementation with unroll and memory partition directives |

TABLE 3

Resource usage for the filter sub band benchmark

| Source | LUT | FF | DSP | DRAM | Latency | Clock period (ns) |
|---|---|---|---|---|---|---|
| C | 2,050 | 1,115 | 14 | 2 | 23,746 | 17.22 |
| C-inter | 6,633 | 11,911 | 28 | 98 | 1,581 | 18.34 |
| C-high | 6,633 | 11,911 | 28 | 98 | 1,581 | 18.34 |
| framework-01 | 38,132 | 77,945 | 162 | 0 | 648 | 20.00 |
| framework-02 | 9,480 | 19,196 | 31 | 0 | 1,083 | 15.97 |
| framework-03 | 12,065 | 18,840 | 59 | 0 | 563 | 18.34 |
| framework-04 | 23,746 | 45,107 | 112 | 321 | 621 | 18.34 |
| framework-05 | 12,676 | 23,554 | 59 | 0 | 557 | 15.89 |
| framework-06 | 23,291 | 30,074 | 112 | 0 | 461 | 18.34 |
| framework-07 | 47,537 | 42,598 | 118 | 0 | 293 | 17.09 |
| framework-08 | $4.41 \times 10^5$ | $2.22 \times 10^5$ | 3,584 | 0 | 74 | 17.22 |

The effectiveness of the method and apparatus for multiple optimization levels is depicted in Table 1. Level 01 applies no directives or code restructuring. Level 02 passes through all the steps shown in FIG. 3 but does not implement the fifth step 340 optimizations. Level 03 adds automated memory partitioning directives to the previous level. Level 04 applies the memory optimizations in the fifth step 350. Level 05 adds the arithmetic optimizations to Level 03, and Level 06 adds the arithmetic optimizations to level 04. Level 07 and 08 apply full array partitioning to Level 05 and 06 respectively.

TABLE 1

Optimization levels

| Optimization level | Brief Description |
|---|---|
| 01 | No DFG optimizations |
| 02 | DFG is folded as much as possible, and unfolded accordingly to values in the configurations file 370 |
| 03 | Adds memory partitioning to level 02 |
| 04 | Adds data reuse to level 03 |
| 05 | Adds arithmetic optimizations to Level 03 |
| 06 | Adds arithmetic optimizations to Level 04 |
| 07 | Adds full partition to Level 05 |
| 08 | Adds full partition to Level 06 |

The results of the C code generated considering these optimizations is compared over the input C code with manual optimizations. The C code baselines are briefly summarized in Table 2. It is a fair assumption that a software programmer could use some very basic directives. However, it cannot be assumed that a typical software programmer is proficient with all types of directives. So, this approach to the evaluation allows the study of the effectiveness of the method and for different levels of hardware design knowledge.

The speed and resource values are obtained through synthesizing the C code with Vivado HLS 2017.4 in a PC with an Intel Core i7-7700 with 32 GB RAM. and targeting an Artix™-7 FPGA, 85K Logic Cells (xc7z020c1g4841). All of the benchmarks had a time constraint of 10 ns except the filter sub band benchmark which has a constraint of 20 ns. The total time of a hardware implementation is calculated as the multiplication between the clock period and latency. The speedups are the result of dividing the total time of the implementations from Table 2 by the total time of the results of the different optimizations levels.

Figure 15:
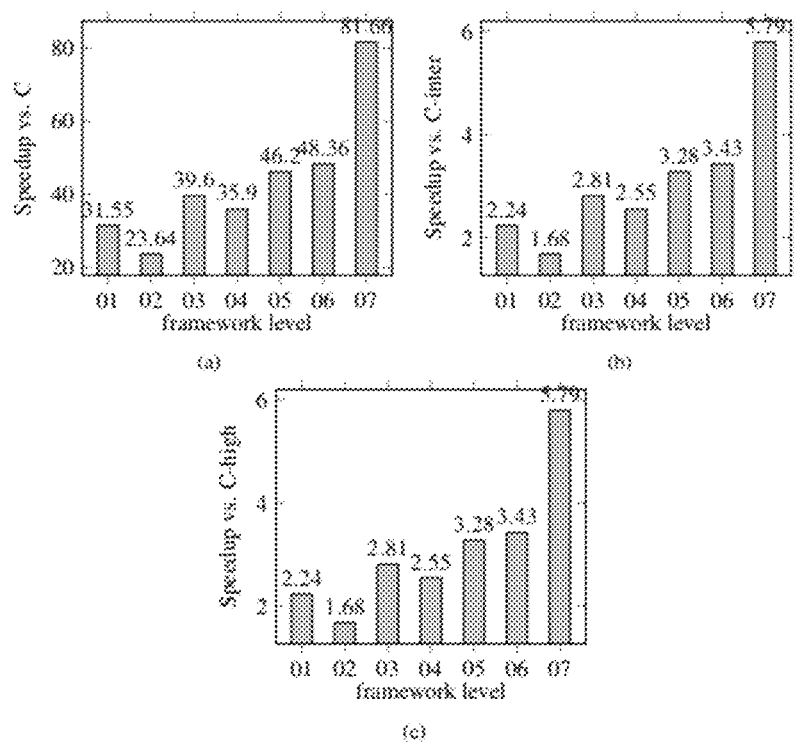
FIG. 15 shows the speedups for filter subband benchmark

The filter sub band benchmark shown in FIG. 15 is a very good example for showing the aspects of the method and apparatus since at every level the method and apparatus presents speedup gains even compared to the C-high. FIG. 15 shows the speedups relative to the original C implementation (left axis) and the optimized C-high implementation (right axis). The explicit values are shown on top of the bar and dots. The bars show the speedup about the original C while the dots show the speedup in reference to C-high. Level 01 has a large speedup because the Level 01 exposes the most ILP since the benchmark has no loops and is completely unrolled. However, its resource usage greatly surpasses the maximum resources of the FPGA used.

To limit the resource usage the method and apparatus folds the dataflow in loops. By folding in level 02 the method and apparatus achieves improved results compared to C-high. This is due to the pipeline generated by the method and apparatus, as seen in Listing 2, which performs the algorithm more efficiently. In Level 03 the speedup increases to 2.81× compared to the C-high version. Level 04 optimizations result in a speedup of 2.55× compared to C-high. This speedup is due to the data the method and apparatus halves the memory reads per iteration. This has a large impact on the pipeline since the method and apparatus can lower the initiation value of a pipeline by lowering the amount of memory reads. The optimized loop is the third step 320 loop, so the fourth step 330 optimization cannot be applied. Therefore, the speedup is lower than Level 03. For this example, the maximum frequencies obtained were around 54.5 Mhz.

Level 05 obtains a speedup of 3.28 times compared to C-high. This is a significant increase compared to 2.81× in level 03. The arithmetic optimizations do not heavily affect the latency or the iteration interval of the implementation. The iteration interval is the time between subsequent iterations. A lower iteration interval indicates that more calculations are being done in parallel, which leads to a lower latency and a lower number of clock cycles. However, by separating the accumulation chains Vivado HLS synthesizes the code differently. Previously to execute the chained sums, Vivado HLS applied adders that are chained together to be more efficient. However, with partial sums Vivado HLS synthesizes addition in parallel. The implementation of these adders is different and therefore the result has a lower frequency that leads to the larger speedup. By adding arithmetic optimizations in level 06 a speedup of 3.43× is obtained. Due to the fact that previously all results of the sums were saved in the output vector Vivado HLS had to write in memory every middle value which is unnecessary. By balancing this chain and storing the result in local variables delays caused by memory accesses are removed. Level 07 obtains a speedup of 5.49× compared to C-high, because by partitioning the memory more ILP is possible. Level 08 has a very large speedup but is not included since the necessary resource are far beyond the capabilities of the target FPGA. When it comes to resource usage all the implementations use more resources since the implementations have more ILP (see Table 3). However, the implementations use fewer BRAMs because the output code no longer uses a local array, and instead stores the values in registers. In the previous method, Vivado HLS dealt with two different loops so the HLS tool had to store the values, calculated in the first loop, in memory before starting the new loop. The only exception is the level 04 that uses a lot of BRAMs. This is because the code of the implementation stores the results of every sum in the output vector. So, to allow pipelining the HLS tool requires to instantiate additional BRAMs to store the result of the sums to ensure values are not lost. However, by partitioning the sums in level 06, Vivado HLS only stores in the output vector at the end. Therefore, the HLS tool does not need any additional BRAMs and instead saves them in registers.

Dotproduct is a simple kernel. The first optimization levels do not lead to better results. Once the method and apparatus apply memory partitioning the method and apparatus matches the speed of the C-high version (see Table 4). The output Level 03 is faster than the basic and inter versions of the input with a 16.8× and a 5.6× speedup, respectively. Without memory redundancy, Level 04 does not change results. The maximum frequency of Level 02 was 156 MHz and the maximum frequency of Level 03 was 112 MHz.

TABLE 4

Resource usage for dotproduct

| Source | LUT | FF | DSP | SRAM | Latency | Clock period (ns) |
|---|---|---|---|---|---|---|
| C | 76 | 90 | 1 | 0 | 6,001 | 6.38 |
| C-pipe | 104 | 83 | 1 | 0 | 1,003 | 8.70 |
| C-high | 294 | 435 | 8 | 0 | 254 | 8.93 |
| framework-01 | 51,284 | 62.33 | 2000 | 0 | 257 | 10.75 |
| framework-02 | 104 | 83 | 1 | 0 | 2,003 | 6.38 |
| framework-03 | 294 | 581 | 8 | 0 | 255 | 8.93 |
| framework-05 | 294 | 581 | 8 | 0 | 255 | 8.93 |
| framework-07 | 294 | 581 | 8 | 0 | 255 | 8.93 |

The 1D fir benchmark shows the impact of optimizations in the fifth step 340. By merely folding in Levels 02 and 03 near identical results to the C-high version were obtained. This is because the method generates the same loops as in the original. The output of Level 03 only has a gain of 1.86× compared to L-inter. Once the method and apparatus optimize the accesses in Level 04, the speedup is of 14.39× compared to C-high version and 26.7× compared to the C-inter. This is a significant improvement to an already optimized implementation. This FIR benchmark uses N=32 taps (coefficients). Thus, we need 32 inputs to calculate a new output. However, 31 inputs are reused from the previous iteration so only one new value is read with this optimization, leading to the significant performance increase. The arithmetic optimizations of Level 06 do not impact the speedup compared to 04. Level 07 optimization have a large impact reaching a speedup of 8 times compared to 1× of 05. This is due to memory partitioning minimizing the memory bottleneck. Partitioning the memory in Level 08 increases the speedup of 06 to 16.18× compared to C-high. Again, the resource usage is increased by the exposure of more ILP (see Table 5). The most noticeable increases are in flip flops (FF) to store more values and in DSP (Digital Signal Processing) to do more concurrent multiplications. For every level the maximum frequency was 114 MHz. LUT in the table means Look-Up Table.

TABLE 5

Resource usage for 1D fir

| Source | LUT | FF | DSP | SRAM | Latency | Clock period (ns) |
|---|---|---|---|---|---|---|
| C | 206 | 170 | 3 | 0 | 29,251 | 8.51 |
| C-inter | 1,556 | 702 | 6 | 0 | 3,605 | 8.74 |
| C-high | 4,623 | 2,968 | 117 | 0 | 1,942 | 8.74 |
| framework-01 | $5.37 \cdot 10^6$ | $3.03 \cdot 10^5$ | 19,155 | 0 | 962 | 8.74 |
| framework-02 | 3,945 | 2,912 | 126 | 0 | 1,929 | 8.74 |
| framework-03 | 3,945 | 2,912 | 126 | 0 | 1,929 | 8.74 |
| framework-04 | 4,587 | 6,579 | 192 | 0 | 135 | 8.74 |

TABLE 5-continued

Resource usage for 1D fir

| Source | LUT | FF | DSP | SRAM | Latency | Clock period (ns) |
|---|---|---|---|---|---|---|
| framework-05 | 3,945 | 2,912 | 126 | 0 | 1,929 | 8.74 |
| framework-06 | 4,587 | 6,579 | 192 | 0 | 135 | 8.74 |
| framework-07 | 12,774 | 13,136 | 192 | 0 | 242 | 8.74 |
| framework-08 | 4,297 | 5,641 | 192 | 0 | 120 | 8.74 |

Autocorrelation is another kernel that shows very interesting results. The autocorrelation consists of a small outermost loop with a big internal loop. The method already obtains positive results by Level 02 with 1.3× gain compared to C-high and 2.7× compared to C-inter. This is because of the innermost loop, which the unroll directive on the outer loop does not consider loop fusion of the unrolled code. The directive generates multiple independent copies of the inner loop. The manual unfolding combines them in a single loop and exposes more ILP. It has many benefits in the Autocorrelation application which has a lot of redundant memory use. If the pipelines are separated, then Vivado HLS will not take advantage of the redundant accesses in the kernel and schedules many more memory reads. This improved loop unrolling capacity highlights another superiority of the DFG approach as the DFG approach of this document allows the generation of better unrolled loops since there is only a need to replicate the dataflow and continue having a single inner loop. As mentioned, this application has a lot of redundant memory, so the application is a prime target for the Level 04 optimization. When the method and apparatus optimize the memory usage a large increase in speed is seen, 7.9× times faster than C-high. This large increase in speed comes at a cost of a large increase in resource usage (see Table 6). This increase is due to the fact that by applying memory optimization to the third step 320 loop there is no folding at the fourth step 330, so the resulting code is far more unrolled. The arithmetic optimizations in Level 06 do not increase the speedup relative to level 04. Level 08 reaches a speedup of 47.49× compared to C-high which is far bigger than the rest. This is because the method completely partitions the input array, and in the case of the Level 06 Autocorrelation benchmark a lot of cycles were dedicated to reading the sd values before starting the loop. Reading them all in a single cycle hugely affects the output. However, this level of partitioning is possible because the autocorrelated vector is a small input vector of 170 integer values. Larger vectors cannot be fully partitioned. Level 08 does not increase a lot the resource usage compared to level 06. All the levels obtain a maximum frequency of 130 MHz.

TABLE 6

Resource usage for Autocorrelation

| Source | LUT | FF | DSP | BRAM | Latency | Clock period (ns) |
|---|---|---|---|---|---|---|
| C | 106 | 107 | 1 | 0 | 6,421 | 6.38 |
| C-inter | 400 | 310 | 1 | 0 | 1,604 | 8.46 |
| C-high | 1,986 | 894 | 10 | 0 | 1,643 | 7.66 |
| framework-01 | 41,868 | 31,170 | 1,600 | 0 | 853 | 7.66 |
| framework-02 | 930 | 459 | 10 | 0 | 655 | 7.66 |
| framework-03 | 1,117 | 603 | 10 | 0 | 655 | 7.66 |
| framework-04 | 9,083 | 7,277 | 160 | 0 | 655 | 7.66 |

TABLE 6-continued

Resource usage for Autocorrelation

| Source | LUT | FF | DSP | BRAM | Latency | Clock period (ns) |
|---|---|---|---|---|---|---|
| framework-05 | 1,117 | 587 | 10 | 0 | 655 | 7.66 |
| framework-06 | 9,083 | 7,277 | 160 | 0 | 96 | 8.60 |
| framework-07 | 1,282 | 3,567 | 11 | 0 | 669 | 8.26 |
| framework-08 | 8,025 | 7,114 | 160 | 0 | 16 | 8.60 |

As in some of the previous cases for the 2D Convolution benchmark, levels 02 and 03 generate identical loops so there is no speedup compared to C-high and 1.6× times speedup compared to C-inter. With a 3×3 kernel every time we move to the next pixel need to read the 9 adjacent pixels. As, 6 of those were used in the calculation of the previous pixel only 3 new values are needed.

TABLE 7

Resource usage for 2D Convolution

| Source | LUT | FF | DSP | BRAM | Latency | Clock period (ns) |
|---|---|---|---|---|---|---|
| C | 994 | 721 | 3 | 0 | $3.04 \cdot 10^5$ | 8.51 |
| C-inter | 277 | 2,977 | 6 | 0 | 19,294 | 8.74 |
| C-high | 5,169 | 5,833 | 36 | 0 | 11,606 | 8.74 |
| framework-02 | 5,249 | 6,000 | 39 | 0 | 11,578 | 8.74 |
| framework-03 | 5,249 | 6,000 | 39 | 0 | 11,578 | 8.74 |
| framework-04 | 5,354 | 6,575 | 54 | 0 | 8,563 | 8.74 |
| framework-05 | 4,750 | 3,082 | 51 | 0 | 11,577 | 8.74 |
| framework-06 | 4,085 | 3,461 | 57 | 0 | 7,097 | 8.74 |
| framework-07 | 6,376 | 3,408 | 57 | 0 | 3,886 | 8.74 |
| framework-08 | 5,862 | 3,794 | 60 | 0 | 3,125 | 12.97 |

By applying data reuse at Level 04 we achieve a speedup of 1.36× compared to C-high and 2.25× compared to C-inter. In this case the iteration interval achieved for the pipeline of the inner loop was 3 instead of 6 due to less memory accesses. The speedup is not as large as expected because by adding memory reuse we change the structure of the loops. The 2D convolution uses two nested loops to traverse the 2D array. In the original code there is no operations between the outer and inner loop, so the original code is a perfect loop. By optimizing the memory accesses, the buffers are loaded before entering the inner loop, so the outer loop is no longer a perfect loop. Previously, the Vivado HLS automatically flattened the loops and optimized the execution. Without a perfect loop that is not possible, and the improvement is not as high as expected. The resource usage is only slightly larger than the C-high version (see Table 7). The 2D Convolution has far more operations than the other benchmarks and cannot be implemented completely unfolded by Vivado HLS. Therefore, there are no results for Level 01.

In level 06 this speedup is increased by combining the speedup with arithmetic optimizations. The differentiator here is optimizing the division in the loop. Since the divisor is common in every iteration, the method calculates the inverse outside the loop and substitutes the division by a multiplication with the inverse. Since multiplications are more efficient in hardware than divisions, the pipeline depth decreases by. Thus, the speedup of this level is of 1.64×. The results of Level 05 shows that arithmetic optimizations without data reuse do not have a big impact simply because of loop flattening. Like in Level 06 the iteration latency is decreased but due to loop flattening the implementation only has one loop and lowering the iteration latency in a large pipeline with many steps does not have a large impact, because the divisions still has to be implemented outside the loop before starting the pipeline. On level 06 without loop flattening a smaller pipeline is going to be executed multiple times in a loop, so decreasing the iteration latency has a bigger impact. Another benefit of the division optimization is that the division optimization lowers the resource usage (see Table 7). As partitioning the arrays in Levels 07 and 08 achieves speedups of 2.99× and 2.5× respectively. Unlike in other cases, level 07 has a better implementation than 08. This is due to the way that Vivado HLS implements the two solutions in this case. Level 08 has a pipeline with a lower interaction interval and lower depth than 07. The partitioning of 08 actually performs better, but the implementation of Vivado HLS worsen the results because the inner loop is unrolled by a factor of 2 and Vivado HLS implements the last two multiplications in a single unit with larger frequency than a single multiplier. This does not happen in 07 and, therefore the frequency is lower, leading to the higher speedup. For level 07, if the memory partition is applied but not the arithmetic ones, the speedup would only be of 2.27×, because the accumulation chains lower the effectiveness of the implementations. Therefore, it is not just a question of partitioning memory with directives. It is also necessary to restructure the code to unlock more ILP and larger speedups. Every optimization levels of this benchmark achieve the maximum frequency of 114 MHz All C codes were fully generated by the method and apparatus without manual intervention and the results presented strongly show the usefulness of the approach and specifically of the method and apparatus of this document.

The execution times of the backend 135 were measured. For most benchmarks the execution time was between 1 and 2 seconds, except for the 2D Convolution benchmark that averaged between 11 and 12 seconds because this 2D Convolution benchmark is also the benchmark with the largest DFGs. Another exception is the Level 04 for the Autocorrelation benchmark that executes in 5 seconds. Due to memory optimizations there is no fourth step 330 folding, and a large DFG is input to the output code step 370. The fastest levels are 02 and 03. Although Level 01 implements no optimizations outputting a large DFG leads to long execution times. The increase of the execution time for Level 04 depends on the complexity and size of the optimized loop.

To analyze the impact of the dataset sizes, and consequently of the input DFG size, on the execution time of the backend, the execution times of the backend was measured for different input sizes of the 2D Convolution benchmark. The chosen optimization level for the measurements was 07. The measurement comprises the execution times needed for the completion of the steps 310 to 360 until the generation of the C code in step 360 and when the input image sizes are 64×64, 96×96, 128×128 and 160×160. At input size of 96×96 it takes 50 seconds to execute the backend. By increasing this input size to 128×128 it takes the backend almost 2.8 minutes to be execute. An input image of 160×160 requires around 7 minutes to be processed in the backend. Assuming this rate of growth between iterations is consistent it would require around 28 minutes to process a 256×256 input image, which is a long time for a modest pixel resolution. Thus, the current implementation of the approach is not very scalable for large input traces.

Analyzing the time required for every step, it is clear that the reason for the large increase is the time required for processing the second step 310. The time required for the fourth to the seventh steps 330 to 360 do not change depending on the input size since the third step 320 always compacts the input DFG to the same size. The third step 320 also does not take much longer for bigger inputs. Because the processing of the second step 310 allows the matching of the third step 320 to be applied efficiently. It is the second step 310 that requires substantial execution time. An output image of 96×96 pixels has 9216 outputs and 128×128 has 16384 outputs, i.e. almost twice as many outputs. As described above, the backend isolates every dataflow that generates an output. Each is leveled and then compared for the common nodes. This implies that for a 128×128 image, the backend generates, levels, and compares 16384 dataflows. A way to accelerate the backend and make the approach more scalable would be a more efficient implementation of the second step 310. For example, the second step 310 could be optimized to separate common nodes and unique nodes as the DFGs of the outputs are being generated.

Currently, the method and apparatus attempt to optimize the speed given the configurations. However, the method and apparatus does not present a direct way of dealing with resource usage, except increasing the level of folding or changing the number of concurrent load/stores. But, these indirect ways can unnecessarily limit the optimizations. Additionally, some optimizations, such as the data reuse of the fifth step 340, can lead to high resource usage. Thus, it is possible to consider two aspects to control resource usage: (a) selecting backend optimizations; (b) selecting directives to control the HLS tool. For the Vivado HLS a direct manner of minimizing resource usage is through resource allocation directives. The Vivado HLS allows limiting the number of resources or specific amount of concurrent operations. For example, by limiting the amount of concurrent multiplications to 40 for Level 04 of the benchmark Autocorrelation the resulting implementation uses only 40 DSPs compared to 160, however the speedup to C-high is 6.09× compared to 7.91×. Thus, with one quarter of the DSPs the speedup only decreases to 77% of the original implementation. This example shows a simple case of directly limiting resources without greatly compromising the speedup. Thus, potentially more configurations could be implemented to direct the backend 135 to insert directives to limit resources.

This disclosure presents an approach to transform software code to be more suitable to high-level synthesis (HLS) tools. The approach is based on a dataflow graph (DFG) representation of the computations (at arithmetic, logical, operator level) currently obtained by executing the critical functions of the application previously added with instrumentation code. The approach mainly relies on folding and unfolding graph operations and has been implemented in a method able to fully restructure the code of critical application kernels. Although in the current work C code was considered as an input, the approach has the potential to address different input programming languages via the inclusion of adequate instrumentation code. The backend 135 of the method is capable of automatically restructuring the DFG and generate C code added with directives in an HLS-friendly way. The results achieved are very promising. When compared with the original C codes, the C code generated by the method and apparatus of this disclosure outperforms them and significant speedups are achieved. The achieved C code is even comparable and, in most cases, better than manually optimized C code added with directives. Thus, the approach can enable software developers to target efficient hardware accelerators using typical HLS tools as backend 135 and without requiring support of HLS experts.

Acknowledgments

INESC TEC provided a grant during the course of the development of this work under the project "TEC4Growth-TL-SMILES-5 Pervasive Intelligence, Enhancers and Proofs of Concept with Industrial Impact" (NORTE-01-0145-FEDER-00020) and funds from the project CONTEXTWA (POCI-01-0145-FEDER-016883) were used, both funded by the European Regional Development Fund.

REFERENCES

R. Nane, V. M. Sima, C. Pilato, J. Choi, B. Fort, A. Canis, Y. T. Chen, H. Hsiao, S. Brown, F. Ferrandi, J. Anderson, and K. Bertels. A survey and evaluation of FPGA high-level synthesis tools. IEEE Transactions on Computer-Aided Design of Integrated Circuits and Systems, 35(10):1591-1604, October 2016.

João M. P. Cardoso and Markus Weinhardt High-level Synthesis, pages 23-47. Springer International Publishing, Cham, 2016.

Texas Instrument, TMS320C6000 DSP Library (DSPLIB), accessed in 16 Jun. 2018. URL http://www.ti.com/tool/sprc265

Corina G. Lee, 15 Aug. 2002, accessed in 16 Jun. 2018. URL http://www.eecg.toronto.edu/~corinna/DSP/infrastructure/UTDSP.tar.gz Cong, Jason Huang, Muhuan Pan, Peichen Wang, Yuxin Zhang, Peng. (2016). Source-to-Source Optimization for HLS, pages 137-163. Springer International Publishing, Cham, 2016.

J. M. P. Cardoso, J. Teixeira, J. C. Alves, R. Nobre, P. C. Diniz, J. G. F. Coutinho, and W. Luk. Specifying compiler strategies for FPGA-based systems. In 2012 IEEE 20th International Symposium on Field Programmable Custom Computing Machines, pages 192-199, April 2012.

O. Mencer. ASC: a stream compiler for computing with FPGAs. IEEE Transactions on Computer Aided Design of Integrated Circuits and Systems, 25(9):1603-1617, September 2006.

Andrew Canis, Jongsok Choi, Mark Aldham, Victor Zhang, Ahmed Kammoona, Tomasz Czajkowski, Stephen D. Brown, and Jason H. Anderson. LegUP: An open-source high-level synthesis tool for FPGA based processor/accelerator systems. ACM Trans. Embed. Comput. Syst., 13(2):24:1-24:27, September 2013.

LLVM. The llvm compiler infrastructure project, 2018. URL https://llvm.org.

Maxeler Technologies. Maxcompiler white paper, 2017. https://www.maxeler.com/media/documents/Maxeler-WhitePaperProgramming.pdf.

N. Voss, S. Girdlestone, O. Mencer, and G. Gaydadjiev. Automated dataflow graph merging. In 2016 International Conference on Embedded Computer Systems: Architectures, Modeling and Simulation (SAMOS16), pages 219-226, July 2016.

The invention claimed is:

1. A method for generation of a configuration of a hardware accelerator, comprising:
   inputting a program with a plurality of lines of code describing an algorithm to be implemented on the hardware accelerator to a front end of an apparatus;
   injecting instrumentation code prior before the plurality of lines of code;
   executing the program and generating in the front end an unfolded dataflow graph in memory of the apparatus from the inputted program;
   passing the generated unfolded dataflow graph to a back end of the apparatus;
   identifying repeating patterns in the unfolded dataflow graph and pruning unnecessary nodes:
   optimizing the unfolded dataflow graph in the back end, by at least one of identifying redundant memory accesses and removing redundant memory accesses, providing storage of reused values in buffers, or adapting memory accesses to resources available in the hardware accelerator; and
   generating, from the optimized unfolded dataflow graph, an output program representative of the configuration of the hardware accelerator.

2. The method of claim 1, further comprising at least one of reducing the number of steps in arithmetic operations or increasing the number of concurrent arithmetic operations.

3. The method of claim 1, further comprising identifying pipelining in the unfolded dataflow graph.

4. The method of claim 1, wherein the unfolded dataflow graph comprises a plurality of loops and the method further comprises unfolding one or more of the plurality of loops in the dataflow graph and then repeating the optimization of the dataflow graph.

5. The method of claim 1, wherein the optimizing of the unfolded dataflow graph comprises folding the identified repeating patterns into the dataflow graph.

6. The method of claim 1, wherein the optimizing of the unfolded dataflow graph further comprises converting local arrays to scalar variables.

7. The method of claim 1, further comprising identification of individual dataflows of the unfolded dataflow graph for the output values in an array which are output, and separating common operations on the output from unique operations unique to every one of the outputs, thereby providing a graph with the common operations and a list of graphs with the unique operations.

8. A hardware accelerator comprising a plurality of electronic components, wherein the plurality of electronic components is programmed by an output program generated from an input program, wherein the output program is generated by
   inputting the input program with a plurality of lines of code describing an algorithm to be implemented on the hardware accelerator to a front end of an apparatus;
   injecting instrumentation code before the plurality of the lines of code;
   executing the program and generating in the front end an unfolded dataflow graph in memory of the apparatus from the inputted program;
   passing the generated unfolded dataflow graph to a back end of the apparatus;
   identifying repeating patterns in the unfolded dataflow graph and pruning unnecessary nodes:

optimizing the unfolded dataflow graph in the back end, to thereby generate the output program.

* * * * *